(12) United States Patent
Sugimoto et al.

(10) Patent No.: US 6,943,595 B2
(45) Date of Patent: Sep. 13, 2005

(54) SYNCHRONIZATION CIRCUIT

(75) Inventors: Hirokazu Sugimoto, Hirakata (JP); Toru Iwata, Osaka (JP); Takashi Hirata, Ibaraki (JP)

(73) Assignee: Matsushita Electric Industrial Co., LTD, Osaka (JP)

( * ) Notice: Subject to any disclaimer, the term of this patent is extended or adjusted under 35 U.S.C. 154(b) by 0 days.

(21) Appl. No.: 10/670,510

(22) Filed: Sep. 26, 2003

(65) Prior Publication Data

US 2004/0095170 A1 May 20, 2004

(30) Foreign Application Priority Data

Sep. 27, 2002 (JP) ........................................ 2002-283619

(51) Int. Cl.[7] ................................................. H03L 7/00

(52) U.S. Cl. ...................................... 327/141; 327/144

(58) Field of Search ................................ 327/141, 144, 327/145, 154, 161, 261; 375/364

(56) References Cited

U.S. PATENT DOCUMENTS

| | | | |
|---|---|---|---|
| 4,965,814 A | | 10/1990 | Yoshida et al. .............. 375/362 |
| 6,060,929 A | * | 5/2000 | Takaki et al. ................ 327/262 |
| 6,359,479 B1 | * | 3/2002 | Oprescu ...................... 327/141 |

FOREIGN PATENT DOCUMENTS

JP          5-327676         12/1993

* cited by examiner

*Primary Examiner*—Linh My Nguyen
(74) *Attorney, Agent, or Firm*—Wenderoth, Lind & Ponack, L.L.P.

(57) ABSTRACT

A synchronization circuit includes a state detection circuit for outputting a control signal according to the temporal relationship between a transition point of an input signal and an edge of a synchronization clock, a delay selection circuit for adding a delay to the input signal based on the control signal, and a latch circuit for synchronizing the signal outputted from the delay selection circuit with the synchronization clock. Therefore, synchronization of the input signal can be carried out without adding latency to the input signal.

13 Claims, 9 Drawing Sheets

SYNCHRONIZATION CIRCUIT

FILED OF THE INVENTION

The present invention relates to a synchronization circuit for synchronizing an asynchronously inputted signal with a clock, in a digital signal transmission apparatus.

BACKGROUND OF THE INVENTION

A conventional synchronization circuit synchronizes an asynchronously inputted signal with a synchronization clock, and outputs the synchronized signal (refer to Japanese Published Patent Application No. 5-327676 and USP4965814). Hereinafter, the conventional synchronization circuit will be described with reference to FIG. 17.

FIG. 17 is a block diagram illustrating the construction of the conventional synchronization circuit.

With reference to FIG. 17, a flip-flop 1 receives an input signal SIN that is asynchronous to a synchronization clock SCK and an inverse clock nSCK that is output from an inverter 5, and the flip-flop 1 latches the input signal SIN at a timing of a rising edge of the inverse clock nSCK. A flip-flop 2 receives the input signal SIN and the synchronization clock SCK, and latches the input signal SIN at a timing of a rising edge of the synchronization clock SCK. A flip-flop 3 receives a signal that is selected by a selection circuit 4 and the synchronization clock SCK, and outputs a synchronizing signal SOUT at a timing of the rising edge of the synchronization clock SCK. The selection circuit 4 selects either the output of the flip-flop 1 or the output of the flip-flop 2 based on a control signal CTL that is output from a switching control circuit 6. The inverter 5 receives the synchronization clock SCK, and outputs the an inverse clock nSCK that is obtained by inverting the synchronization clock SCK. The switching control circuit 6 outputs a control signal CTL according to the temporal relationship between a transition point of the input signal SIN and an edge of the synchronization clock SCK.

Hereinafter, the operation of the conventional synchronization circuit as constructed in the manner as described above with reference to FIG. 17 will be described.

The asynchronous input signal SIN is applied to respective data terminals D of the flip-flops 1 and 2.

When the inverse clock nSCK that is outputted from the inverter 5 is input to the flip-flop 1 through a clock input terminal CK, the flip-flop 1 latches the input signal SIN at a timing of the rising edge of the inverse clock nSCK, and outputs the signal to the selection circuit 4 through a data output terminal Q.

Further, when the synchronization clock SCK is input to the flip-flop 2 through a clock input terminal CK, the flip-flop 2 latches the input signal SIN at a timing of the rising edge of the synchronization clock SCK, and outputs the signal to the selection circuit 4 through a data output terminal Q.

On the other hand, the switching control circuit 6 monitors the temporal relationship between the transition point of the asynchronous input signal SIN and the edge of the synchronization clock SCK, and outputs the control signal CTL when detecting that the temporal relationship approaches a predetermined period of time, to thereby control the selection circuit 4.

The flip-flop 3 latches the signal that is selected by the selection circuit 4 at a timing of the rising edge of the synchronization clock SCK, and outputs a synchronizing signal SOUT through a data output terminal Q.

In this way, the asynchronous input signal SIN is synchronized with the synchronization clock SCK.

However, the signal which is latched at the inverse clock nSCK has already been output from the selection circuit 4 when the switching control circuit 6 detects that the transition point of the asynchronous input signal SIN approaches the edge of the synchronous clock SCK, and this signal is again latched at the synchronization clock SCK by the third flip-flop 3, and as a result, a latency is undesirably added to the signal.

Furthermore, there are many cases where plural pieces of asynchronous signals are input in recent multi-channel digital transmission, and skews between the plural input signals adversely affect data transmission as the input signals become faster. Since, in the conventional technique, there is a possibility that a latency is added to each inputted signal, such skews cause a serious problem in data transmission in which error-free signal synchronization should be carried out.

SUMMARY OF THE INVENTION

The present invention is made to solve the above-described problems, and the object of the present invention to provide a synchronization circuit which can prevent the addition of latency to an input signal, and which is reduced in circuit scale.

Other objects and advantages of the present invention will become more apparent from the detailed description that follows. The detailed description and specific embodiments described herein are provided only for illustration since various additions and modifications within the scope of the present invention will be apparent to those of skill in the art from the detailed description.

According to a first aspect of the present invention, there is provided a synchronization circuit for receiving an input signal and a clock having a frequency which is equal to a transfer rate of the input signal, and synchronizing the input signal with the clock. The synchronization circuit of the first aspect comprises: a state detection circuit for outputting a control signal according to the temporal relationship between a transition point of the input signal and an edge of the clock; a delay selection circuit for adding a delay to the input signal based on the control signal outputted from the state detection circuit; and a latch circuit for synchronizing the signal that outputted from the delay selection circuit with the clock, and outputting the synchronized signal. Therefore, the input signal can be synchronized with the inputted clock without needing to invent the input signal as in the conventional circuit. As a result, a synchronization circuit that can perform the above-described synchronization without adding latency to the input signal can be implemented with a relatively simple construction.

According to a second aspect of the present invention, there is provided a synchronization circuit for receiving an input signal and a clock having a frequency which is equal to a transfer rate of the input signal, and for synchronizing the input signal with the clock. The synchronization circuit of the second aspect comprises: a state detection circuit for outputting a control signal according to the temporal relationship between a transition point of the input signal and an edge of the clock; a delay selection circuit for adding a delay to the clock based on the control signal outputted from the state detection circuit; and a latch circuit for synchronizing the input signal with the clock that is outputted from the delay selection circuit, and outputting the synchronized signal. Therefore, the input signal can be synchronized with the inputted clock without needing to invert the input signal as in the conventional circuit. As a result, a synchronization circuit that can perform the above-described synchronization without adding latency to the input signal can be implemented with a relatively simple construction.

According to a third aspect of the present invention, there is provided a synchronization circuit for receiving plural input signals having phases which are irrelevant to each other and a clock having a frequency which is equal to a transfer rate of the plural input signals, and for synchronizing the plural input signals with the clock. The synchronization circuit of the third aspect comprises: a state detection circuit for outputting control signals relating to the respective input signals according to the temporal relationship between transition points of the plural input signals; a delay selection circuit for adding delays to the respective input signals based on the control signals relating to the respective input signals; and a latch circuit for synchronizing the respective signals outputted from the delay selection circuit with the clock, and outputting the synchronized signals. Therefore, each input signal can be synchronized with the inputted clock without needing to invert the input signal as in the conventional circuit. As a result, a synchronization circuit that can perform the above-described synchronization without adding latency to the input signal can be implemented with a relatively simple construction.

According to a fourth aspect of the present invention, there is provided a synchronization circuit for receiving plural signal bundles each comprising a set of plural input signals which are synchronized with each other and a single clock having a frequency which is equal to a transfer rate of the plural input signals, in which the phases of the input signals which are included in one signal bundle are irrelevant to the phases of the input signals which are included in the other signal bundles, and for synchronizing the input signals which are included in one signal bundle with the input signals which are included in the other signal bundles by using a single synchronization clock that is selected from among the clocks which are included in the respective signal bundles. The synchronization circuit of the fourth aspect comprises: a state detection circuit for detecting the state between the plural input signals which are included in the respective signal bundles; a clock selection circuit for receiving the clocks which are included in the respective signal bundles, and selecting one of the inputted clocks, as a synchronization clock, based on the result of the state detection performed between the respective signal bundles by the state detection circuit; a delay selection circuit for adding delays to the plural input signals which are included in each signal bundle based on the result of the state detection performed between the respective signal bundles; and a latch circuit for synchronizing the output signal from the delay selection circuit for each signal bundler with the synchronization clock, and outputting the synchronized signal. Therefore, the plural signal bundles which are inputted asynchronously with each other can be synchronized with each other without inverting the plural input signals which are included in the respective signal bundles. As a result, a synchronization circuit that can perform synchronization without adding latency to the input signals can be implemented with relatively simple construction.

According to a fifth aspect of the present invention, in accordance with the synchronization circuit of the fourth aspect, the state detection circuit comprises: an early/late detection circuit for detecting which signal bundle is earlier in input timing between the respective signal bundles, and outputting an early/late detection signal; and an overlap detection circuit for detecting an overlap period between the respective signal bundles, and outputting an overlap detection signal. Further, according to the fifth aspect, the clock selection circuit selects, as a synchronization clock, a clock that is included in a signal bundle which is determined as being inputted earlier between the respective signal bundles based on the early/late detection signal, Moreover, the delay selection circuit adds delays based on the early/late detection signal and the overlap detection signal, to the plural input signals which are included in the respective signal bundles. Therefore, a synchronization circuit that can synchronize plural signal bundles regardless of the presence or absence of an overlap period between data to be synchronized, which data are included in the respective signal bundles, can be implemented with a relatively simple construction.

According to a sixth aspect of the present invention, in accordance with the synchronization circuit of the first aspect, the delay selection circuit comprises: a delay circuit for adding a delay to the input signal; and a selection circuit for selecting either the input signal or the output signal of the delay circuit based on the control signal outputted from the state detection circuit. Since a delay is added to the input signal based on the control signal, it becomes unnecessary to invert the input signal as in the conventional circuit, thereby resulting in a synchronization circuit that can avoid the addition of latency to the input signal.

According to a seventh aspect of the present invention, in accordance with the synchronization circuit of the second aspect, the delay selection circuit comprises: a delay circuit for adding a delay to the inputted clock; and a selection circuit for selecting either the inputted clock or the clock that is outputted from the delay circuit based on the control signal outputted from the state detection circuit. Therefore, a synchronization clock, which is obtained by adding a delay to the clock based on the control signal, can be used for synchronizing the input signal. As a result, it becomes unnecessary to invert the input signal as in the conventional circuit, thereby resulting in a synchronization circuit that can avoid the addition of latency to the input signal.

According to an eighth aspect of the present invention, in accordance with the synchronization circuit of the third aspect, the delay selection circuit comprises: a delay circuit for adding delays to the respective input signals; and a selection circuit for selecting one from among the plural input signals and the signals which are outputted from the delay circuit, for each of the plural input signals, based the control signals relating to the respective input signals, and for outputting the selected signal. Since a delay is added to each input signal based on each control signal, it becomes unnecessary to invert the input signal as in the conventional circuit, thereby resulting in a synchronization circuit that can avoid the addition of latency to the input signal.

According to a ninth aspect of the present invention, in accordance with the synchronization circuit of any one of the first through fifth aspects, the state detection circuit detects the state of the input signal based on an externally supplied preamble detection signal which indicates the positional relationship of the data to be synchronized. Therefore, the positional relationship of the data to be synchronized can be easily determined.

DETAILED DESCRIPTION OF THE PREFERRED EMBODIMENTS

Hereinafter, embodiments of the present invention will be described with reference to the drawings. The embodiments described herein are merely examples, and the present invention is not restricted thereto.

First Embodiment

Hereinafter, a synchronization circuit according to a first embodiment of the present invention will be described with reference to FIGS. 1 and 2.

Figure 1:
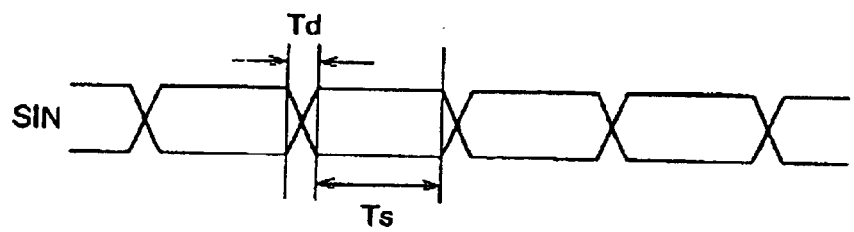
FIG. 1 is a waveform diagram of an input signal.

FIG. 1 is a waveform diagram illustrating an asynchronous input signal SIN that is input to a synchronization circuit according to the present invention, wherein a period Ts is a signal definite period in which a set-up hold time of the signal SIN is ensured, and a period Td is a signal indefinite period in the vicinity of a transition point of the asynchronous input signal SIN.

Figure 2:
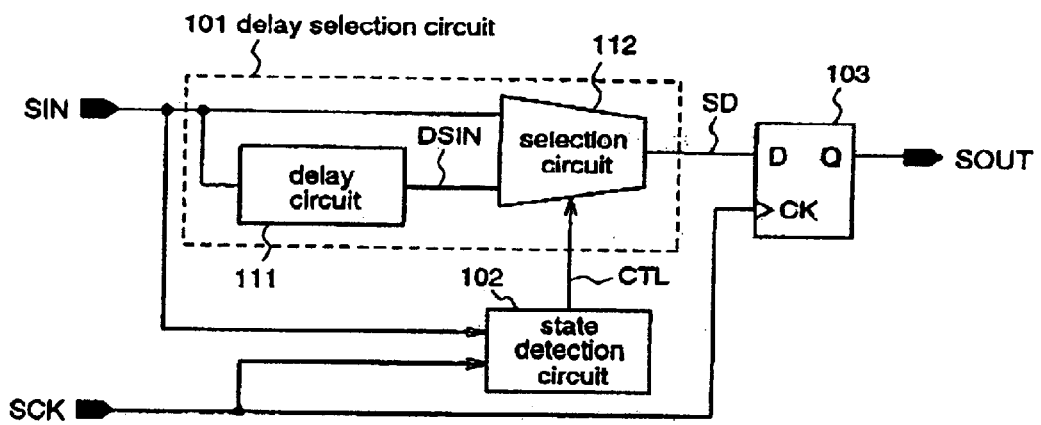
FIG. 2 is a block diagram illustrating the construction of a synchronization circuit according to a first embodiment of the present invention.

FIG. 2 is a block diagram illustrating the construction of the synchronization circuit according to the first embodiment.

The synchronization circuit shown in FIG. 2 is provided with a state detection circuit 102 for outputting a control signal CTL according to the temporal relationship between a transition point of the input signal SIN and an edge of a synchronization clock SCK, a delay selection circuit 101 for adding a delay to the input signal SIN based on the control signal CTL outputted from the state detection circuit 102, and a latch circuit (flip-flop) 103 for synchronizing an output signal SD of the delay selection circuit 101 with the synchronization clock SCK.

Figure 5:
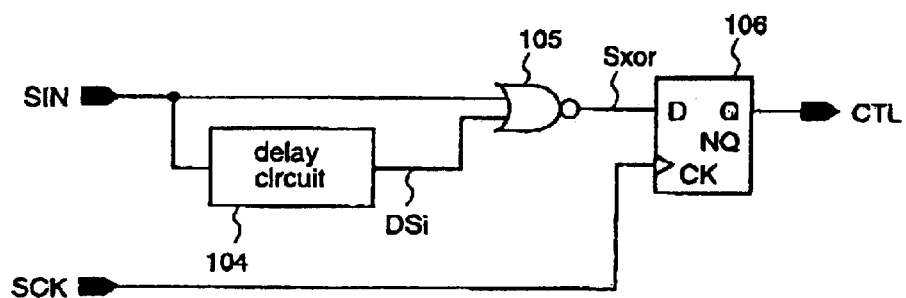
FIG. 5 is a diagram illustrating the construction of a state detection circuit.

The state detection circuit 102 sets the control signal CTL at "High" and outputs the control signal CTL, when the edge of the synchronization clock SCK exists in a period where a sufficient set-up hold time is not ensured for the input signal SIN, i.e., in the signal indefinite period Td shown in FIG. 1. On the other hand, the state detection circuit 102 sets the control signal CTL at "Low" and does not output the control signal CTL when the edge of the synchronization clock SCK exists in the signal definite period Ts. As shown in FIG. 5, the state detection circuit 102 can be implemented as a circuit comprising a delay circuit 104 which adds a delay to the input signal SIN, an XOR circuit 105 which receives the input signal SIN and an output signal DSi of the delay circuit 104 and which outputs a signal Sxor, and a flip-flop 106 which receives the output signal Sxor of the XOR circuit 105 and the synchronization clock SCK and which outputs the control signal CTL.

The delay selection circuit 101 comprises a delay circuit 111 for adding a delay to the input signal SIN, and a selection circuit (2:1 selector) 112 for selecting either the input signal SIN or an output signal DSIN of the delay circuit 111 based on the control signal CTL outputted from the state detection circuit 102. The selection circuit 112 selects the output signal DSIN of the delay circuit 111 when the control signal CTL is input thereto.

Hereinafter, the operation of the synchronization circuit of the first embodiment as constructed in the manner as described above will be described with reference to FIGS. 3 and 4.

The input signal SIN is input to the delay selection circuit 101 and the state detection circuit 102, and the synchronization clock SCK is input to the state detection circuit 102 and the flip-flop 103. While the transfer rate of the input signal SIN is equal to the frequency of the synchronization clock SCK, the phase of the input signal SIN is irrelevant to the phase of the synchronization clock SCK.

Initially, in the delay selection circuit 101, the delay circuit 111 adds a delay to the input signal SIN, and outputs the delay-added signal DSIN to the selection circuit 112.

On the other hand, the state detection circuit 102 performs a comparison of phases between the input clock CK and the input signal SIN.

Figure 3:
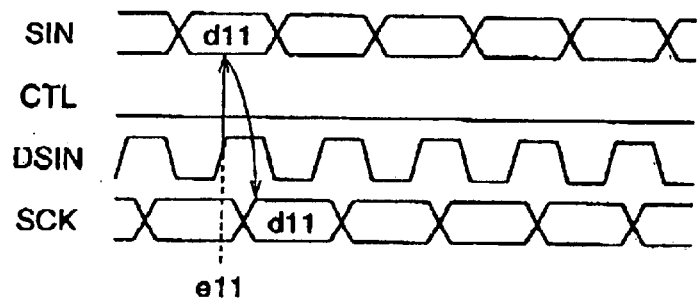
FIG. 3 is a timing chart in the synchronization circuit according to the first embodiment.

As a result of the phase comparison that is performed by the state detection circuit 102, when it is detected that an edge e11 of the synchronization clock SCK exists in the signal definite period Ts of data d11 of the input signal SIN as shown in FIG. 3, the control signal CTL remains at "Low" and is not output to the delay selection circuit 101. Accordingly, in the selection circuit 112 in the delay selection circuit 101, the input signal SIN is selected and outputted as a signal SD to the flip-flop 103. In the flip-flop 103, the data d11 of the signal SD which is outputted from the delay selection circuit 101 is synchronized with the synchronization clock SCK to be output as a synchronizing signal SOUT.

Figure 4:
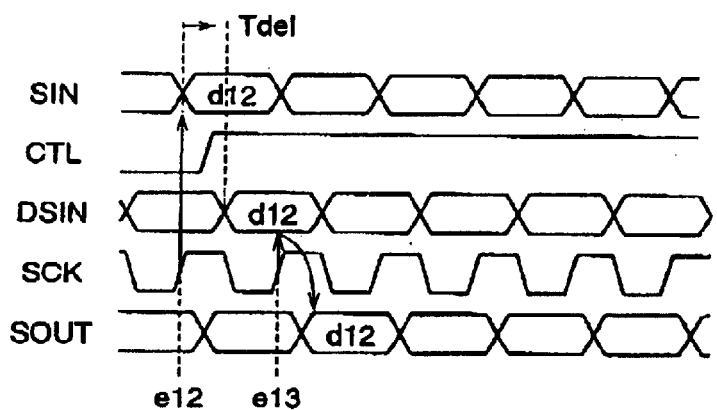
FIG. 4 is a timing chart in the synchronization circuit according to the first embodiment.

Further, as a result of the phase comparison that is performed by the state detection circuit 102, when it is detected that an edge e12 of the synchronization clock SCK exists in the signal indefinite period Td of data d12 of the input signal SIN as shown in FIG. 4, the control signal CTL is changed from "Low" to "High", and the control signal CTL is to be output to the delay selection circuit 101. Accordingly, in the selection circuit 112 in the delay selection circuit 101, the output signal of the delay circuit 111, i.e., the signal DSIN which is obtained by adding a delay time Tdel to the input signal SIN, is selected and outputted as a signal SD to the flip-flop 103. In the flip-flop 103, the data d12 of the signal SD which is outputted from the delay selection circuit 101 is latched at an edge e13 of the synchronization clock SCK so as to be output as a synchronizing signal SOUT.

While in the above description the operation of the selection circuit 112 is switched when the output from the state detection circuit 102 is "High", the present invention is not restricted thereto.

The synchronization circuit according to the first embodiment is provided with the state detection circuit 102 for outputting the control signal CTL according to the temporal relationship between the transition point of the input signal SIN and the edge of the synchronization clock SCK, the delay selection circuit 101 for adding a delay to the input signal SIN based on the control signal CTL outputted from the state detection circuit 102, and the latch circuit 103 for synchronizing the signal SD which is outputted from the delay selection circuit 101 with the synchronization clock SCK. Since it is not necessary to invert the input signal SIN as in the conventional circuit, the input signal SIN can be synchronized with the synchronization clock SCK without considering the temporal relationship between the signal indefinite period of the input signal SIN and the edge of the synchronization clock SCK. As a result, a synchronization circuit that can perform the above-described synchronization without adding latency to the input signal can be implemented with a relatively simple construction.

Second Embodiment

Hereinafter, a synchronization circuit according to a second embodiment of the present invention will be described with reference to FIG. 6.

Figure 6:
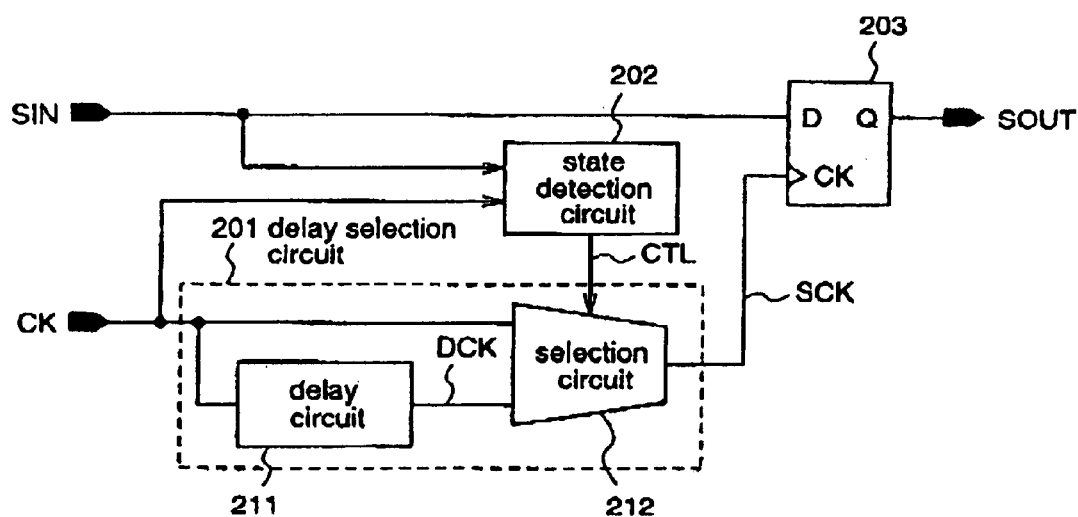
FIG. 6 is a block diagram illustrating the construction of a synchronization circuit according to a second embodiment of the present invention.

FIG. 6 is a block diagram illustrating the construction of the synchronization circuit according to the second embodiment.

The synchronization circuit shown in FIG. 6 is provided with a state detection circuit 202 for outputting a control signal CTL according to the temporal relationship between a transition point of an input signal SIN and an edge of an input clock CK, a delay selection circuit 201 for adding a delay to the input clock CK based on the control signal CTL outputted from the state detection circuit 202, and a flip-flop 203 for synchronizing the input signal SIN with a clock SCK that is selected by the delay selection circuit 201.

The state detection circuit 202 sets the control signal CTL at "High" and outputs the control signal CTL when the edge of the synchronization clock SCK exists within a period in which a sufficient set-up hold time is not ensured for the input signal SIN, i.e., the signal indefinite period Td shown in FIG. 1. On the other hand, the state detection circuit 202 sets the control signal CTL at "Low" and does not output the control signal CTL when the edge of the synchronization clock SCK exists within the signal definite period Ts shown in FIG. 1. The state detection circuit 202 can be implemented by the circuit shown in FIG. 5.

The delay selection circuit 201 is provided with a delay circuit 211 for adding a delay to the input clock CK, and a selection circuit (2:1 selector) 212 for selecting either the input clock CK or an output clock DCK of the delay circuit 211 based on the control signal CTL outputted from the state detection circuit 202. The selection circuit 212 selects the output clock DCK of the delay circuit 211 when the control signal CTL is input thereto.

The operation of the synchronization circuit of the second embodiment as constructed in the manner as described above will now be described with reference to FIGS. 7 and 8.

The input signal SIN is input to the state detection circuit 202 and the flip-flop 203, and the input clock CK is input to the state detection circuit 202 and the delay selection circuit 201. Although the transfer rate of the input signal SIN is equal to the frequency of the input clock SCK, the phase of the input signal SIN is irrelevant to the phase of the input clock SCK.

First of all, in the delay selection circuit 201, the delay circuit 211 adds a delay to the input clock CK, and outputs the delay-added clock DCK to the selection circuit 212.

On the other hand, the state detection circuit 202 performs a comparison of phases between the input clock CK and the input signal SIN.

Figure 7:
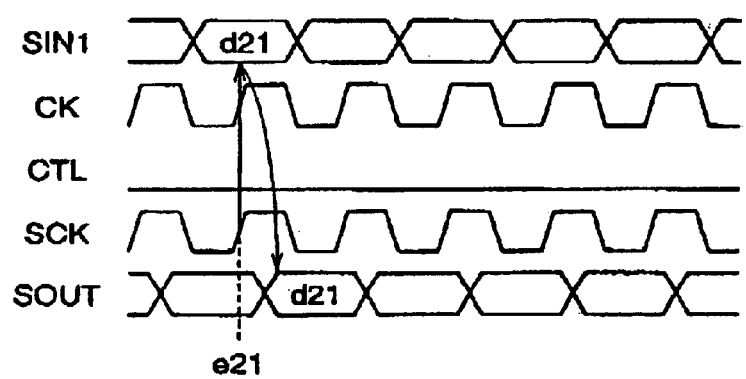
FIG. 7 is a timing chart in the synchronization circuit according to the second embodiment.

As a result of the phase comparison that is performed by the state detection circuit 202, when it is detected that an edge e21 of the input clock exists in the signal definite period Ts of data d21 of the input signal SIN as shown in FIG. 7, the control signal CTL remains at "Low" and is not output to the delay selection circuit 201. Accordingly, in the selection circuit 212 in the delay selection circuit 201, the input clock CK is selected and outputted as a synchronization clock SCK to the flip-flop 203. In the flip-flop 203, the data d21 of the input signal SIN is synchronized with the synchronization clock SCK to be output as a synchronizing signal SOUT.

Figure 8:
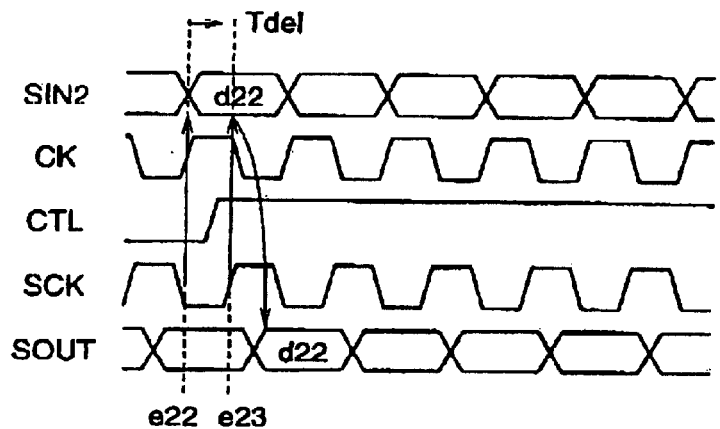
FIG. 8 is a timing chart in the synchronization circuit according to the second embodiment.

Further, as a result of the phase comparison that is performed by the state detection circuit 202, when it is detected that an edge e22 of the input clock exists in the signal indefinite period Td of data d22 of the input signal SIN as shown in FIG. 8, the control signal CTL is changed from "Low" to "High", and the control signal CTL is output to the delay selection circuit 201. Accordingly, in the selection circuit 212 in the delay selection circuit 201, the output signal of the delay circuit 211, i.e., a clock DCK which is obtained by adding a delay time Tdel to the input clock CK, is selected and outputted as a synchronization clock CK to the flip-flop 203. In the flip-flop 203, the data d22 of the input signal SIN is latched at an edge e23 of the clock SCK which is outputted from the delay selection circuit 201 to be output as a synchronizing signal SOUT.

While, in the above descriptions the operation of the selection circuit 212 is switched when the output from the state detection circuit 202 is "High", the present invention is not necessarily restricted thereto.

The synchronization circuit according to the second embodiment is provided with the state detection circuit 202 for outputting the control signal CTL according to the temporal relationship between the transition point of the input signal SIN and the edge of the clock CK, the delay selection circuit 201 for adding a delay to the clock CK based on the control signal CTL outputted from the state detection circuit 202, and the latch circuit 203 for synchronizing the input signal SIN with the clock SCK which is outputted from the delay selection circuit 201. Since it is not necessary to invert the input signal SIN as in the conventional circuit, the input signal SIN can be synchronized with the synchronization clock SCK without considering the temporal relationship between the signal indefinite period of the input signal SIN and the edge of the synchronization clock SCK. As a result, a synchronization circuit that can perform the above-mentioned synchronization without adding latency to the input signal can be implemented with a relatively simple construction.

Third Embodiment

Hereinafter, a synchronization circuit according to a third embodiment of the present invention will be described with reference to FIG. 9.

Figure 9:
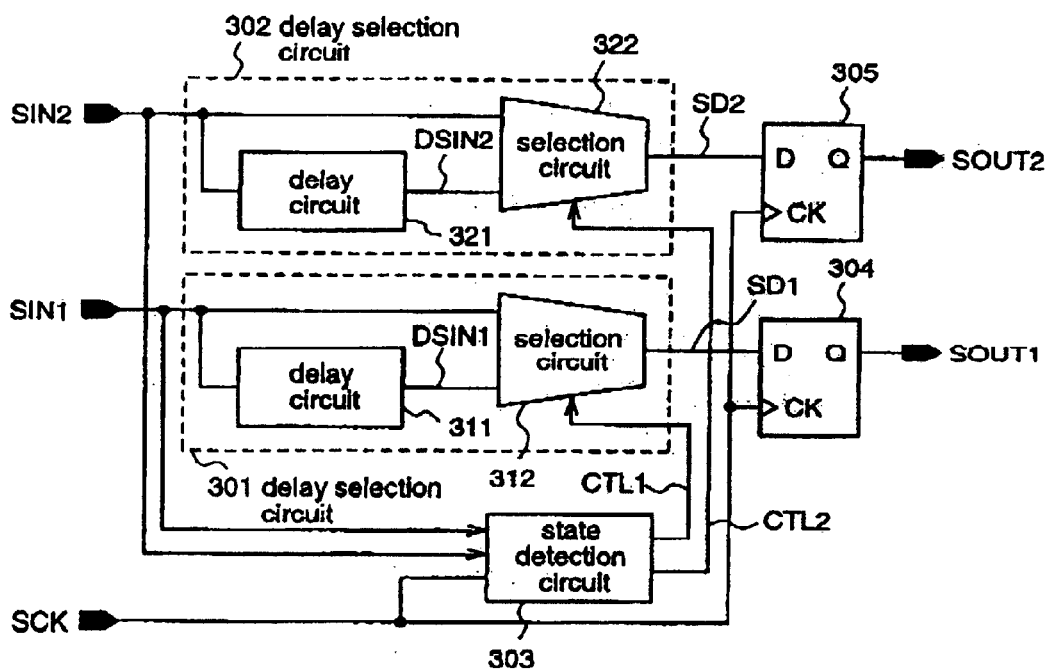
FIG. 9 is a block diagram illustrating the construction of a synchronization circuit according to a third embodiment of the present invention.

FIG. 9 is a block diagram illustrating the construction of the synchronization circuit according to the third embodiment.

The synchronization circuit shown in FIG. 9 is provided with: a state detection circuit 303 for outputting a first control signal CTL1 and a second control signal CTL2 according to the temporal relationships between transition points of a first input signal SIN1 and a second input signal SIN2, and an edge of a synchronization clock SCK, respectively; a first delay selection circuit 301 for adding a delay to the first input signal SIN1 based the first control signal CTL1 outputted from the stated detection circuit 303; a second delay selection circuit 302 for adding a delay to the second input signal SIN2 based on the second control signal CTL2 outputted from the state detection circuit 303; a first flip-flop 304 for synchronizing the output signal of the first delay selection circuit 301 with the synchronization clock SCK so as to output a first synchronizing signal SOUT; and a second flip-flop 305 for synchronizing the output signal of the second delay selection circuit 302 with the synchronization clock SCK so as to output a second synchronizing signal SOUT2.

The state detection circuit 303 outputs the control signal CTL when the edge of the synchronization clock SCK exists within a period in which a sufficient set-up hold time is not secured for the input signal, i.e., the signal indefinite period Td shown in FIG. 1, and the state detection circuit 303 does not output the control signal CTL when the edge of the synchronization clock SCK exists within the signal definite period Ts shown in FIG. 1. The state detection circuit 303 can be implemented by the circuit shown in FIG. 5.

Further, the first delay selection circuit 301 is provided with the first delay circuit 311 for adding a delay to the first input signal SIN1, and a first selection circuit (2:1 selector) 312 for selecting either the first input signal SIN1 or the output signal DSIN of the first delay circuit 311 based on the first control signal CTL1 outputted from the stated detection circuit 303. The first selection circuit 312 selects the output signal SDIN of the first delay circuit 311 when the first control signal CTL1 is input thereto.

Further, the second delay selection circuit 302 is provided with a second delay circuit 321 for adding a delay to the second input signal SIN2, and a second selection circuit (2:1 selector) 322 for selecting either the second input signal SIN2 or the output signal DSIN2 of the second delay circuit 321 based on the second control signal CTL2 outputted from the state detection circuit 303. The second selection circuit 322 selects the output signal DSIN2 of the second delay circuit 321 when the second control signal CTL2 is input thereto.

Hereinafter, the operation of the synchronization circuit of the third embodiment as constructed in the manner as described above will now be described.

The first input signal SIN1 is input to the first delay selection circuit 301 and the state detection circuit 303, the second input signal SIN2 is input to the second delay selection circuit 302 and the state detection circuit 303, and the synchronization clock SCK is input to the state detection circuit 303, the flip-flop 304, and the flip-flop 305. While the transfer rates of the respective input signals SIN1 and SIN2 are equal to the frequency of the synchronization clock SCK, the phases of the first and second input signals SIN1 and SIN2 are irrelevant to the phase of the synchronization clock SCK.

Initially, in the first delay selection circuit 301, the first delay circuit 311 adds a delay to the first input signal SIN1, and outputs the delay-added signal DSIN to the first selection circuit 312. Further, in the second delay selection circuit 302, the second delay circuit 321 adds a delay to the second input signal SIN2, and outputs the delay-added signal DSIN to the second selection circuit 322.

On the other hand, the state detection circuit 303 performs a comparison of phases between the synchronization clock SCK and the first and second input signals SIN1 and SIN2.

As a result of the phase comparison that is performed by the state detection circuit 303, when it is detected that the edge of the synchronization clock SCK exists in the signal indefinite period Td of the first input signal SIN1, the first control signal CTL1 is output to the first delay selection circuit 301. Accordingly, in the first selection circuit 312 in the first delay selection circuit 301, the output signal DSIN1 of the first delay circuit 311 is selected and outputted to the first flip-flop 304 as a signal SD1.

On the other hand, when it is detected that the edge of the synchronization clock SCK exists in the signal definite period Ts of the first input signal SIN1, the first control signal CTL1 is not output to the first delay selection circuit 301 and, therefore, the first input signal SIN1 is selected by the first selection circuit 312 and outputted to the first flip-flop 304 as a signal SD1.

Further, when it is detected that the edge of the synchronization clock SCK exists in the signal indefinite period Td of the second input signal SIN2, the second control signal CTL2 is output to the second delay selection circuit 302. Accordingly, in the second selection circuit 322 in the second delay selection circuit 302, the output signal DSIN2 of the second delay circuit 321 is selected and outputted to the second flip-flop 305 as a signal SD2.

On the other hand, when it is detected that the edge of the synchronization clock SCK exists in the signal definite period Ts of the second input signal SIN2, the second control signal CTL2 is not output to the second delay selection circuit 302 and, therefore, the second input signal SIN2 is selected by the second selection circuit 322 and outputted to the second flip-flop 305 as a signal SD2.

In the first flip-flop 304, the output signal SD1 from the first delay selection circuit 301 is latched at the edge of the synchronization clock SCK to be output as a first synchronizing signal SOUT1. Further, in the second flip-flop 305, the output signal SD2 from the second delay selection circuit 302 is latched at the edge of the synchronization clock SCK to be output as a second synchronizing signal SOUT2.

While, in the above description, two input signals SIN1 and SIN2 are adopted, an arbitrary number of input signals (not less than two) may be adopted. At this time, the number of times of state detection in the state detection circuit 303 changes according to the number of input signals.

The synchronization circuit according to the third embodiment is provided with: the state detection circuit 303 for outputting the first and second control signals CTL1 and CTL2 relating to the respective input signals SIN1 and SIN2 according to the temporal relationship between the transition points of the first and second input signals SIN1 and SIN2, and an edge of the synchronization clock SCK, respectively; the delay selection circuit 302 for adding delays to the respective input signals SIN1 and SIN2 based on the first and second control signals CTL1 and CTL2, respectively; and the first and second latch circuits 304 and 305 for synchronizing the first and second signals SD1 and SD2 which are respectively outputted from the first and second delay selection circuits 301 and circuit 302 with the synchronization clock SCK. Since it is not necessary to invert each input signal as in the conventional circuit, the first input signal SIN1 and the second input signal SIN2 can be synchronized with each other by using the synchronization clock SCK without considering the temporal relationship between the signal indefinite period of each input signal and the edge of the synchronization clock SCK. As a result, a synchronization circuit that can perform the above-described synchronization without adding latency to the input signals can be implemented with a relatively simple construction.

Fourth Embodiment

Hereinafter, a synchronization circuit according to a fourth embodiment of the present invention will be described with reference to FIG. 10.

The synchronization circuit according to the fourth embodiment receives plural signal bundles each comprising a set of plural input signals which are synchronized with each other and a single clock having a frequency which is equal to a transfer rate of the plural input signals, in which the phases of the input signals that are included in one signal bundle are irrelevant to the phases of the input signals that are included in the other signal bundles, and the synchronization circuit synchronizes the input signals that are included in one signal bundle with the input signals that are included in the other signal bundles by using a single synchronization clock that is selected from among the clocks which are included in the respective signal bundles.

Figure 10:
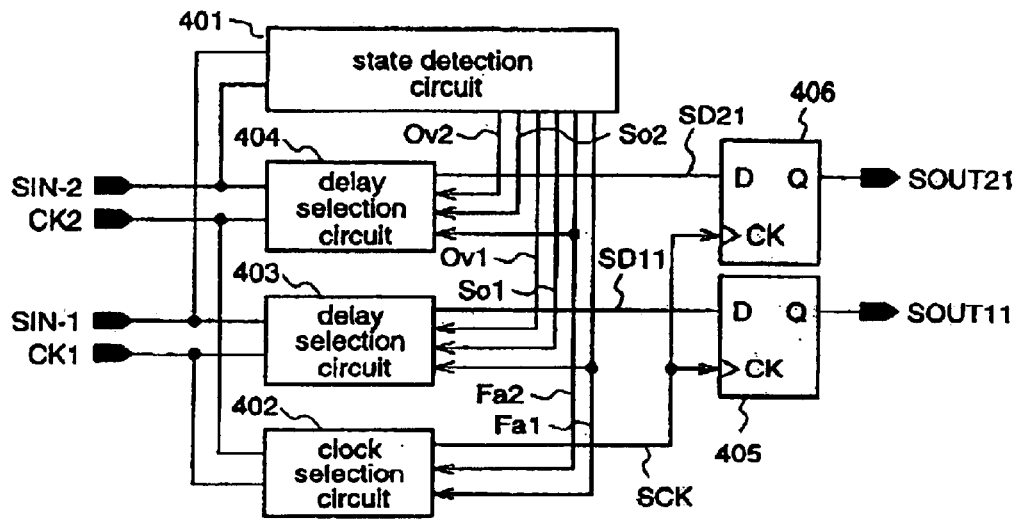
FIG. 10 is a block diagram illustrating the construction of a synchronization circuit according to a fourth embodiment of the present invention.

FIG. 10 is a block diagram illustrating the construction of the synchronization circuit according to the fourth embodiment of the present invention. While plural signal bundles should be input to the synchronization circuit, FIG. 10 shows two signal bundles each comprising a set of a single input signal and a single clock for the sake of convenience. To be specific, in FIG. 10, SIN-1 denotes one of the signals that is included in the first signal bundle, SIN-2 denotes one of the signals that is included in the second signal bundle, CK1 is a clock that is included in the first signal bundle, and CK2 is a clock that is included in the second signal bundle.

The synchronization circuit shown in FIG. 10 is provided with: a state detection circuit 401 for detecting the state between the first input signal SIN-1 and the second input signal SIN-2 which are included in the respective signal bundles; a clock selection circuit 402 for selecting either the first input clock CK1 or the second input clock CK2 based on a result of the state detection that is performed between the respective signal bundles by the state detection circuit 401, and outputting the selected clock as a synchronization clock SCK; a delay selection circuit 403 for adding a first delay to the first input signal SIN-1 based on the result of the state detection that is performed between the respective signal bundles, and outputting the delayed signal as a first signal SD11; a second delay selection circuit 404 for adding a delay to the second input signal SIN-2 based on the result of the state detection that is performed between the respective signal bundles, and outputting the delayed signal as a second signal SD21; a first flip-flop 405 for synchronizing the first signal SD11 with the synchronization clock SCK; and a second flip-flop 406 for synchronizing the second signal SD21 with the synchronization clock SCK.

Figure 12:
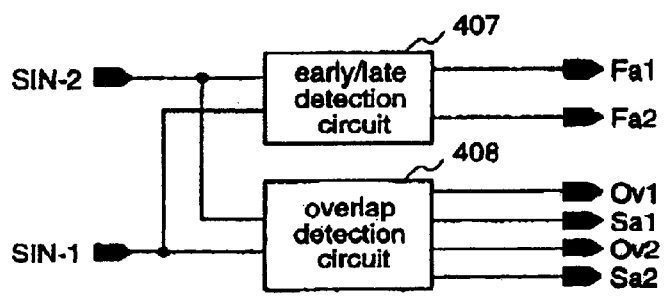
FIG. 12 is a diagram illustrating the construction of a state detection circuit which is included in the synchronization circuit according to the fourth embodiment.

As shown in FIG. 12, the state detection circuit 401 is provided with an early/late detection circuit 407 for detecting as to which signal bundle is earlier in input timing between the respective signal bundles (SIN-1 and SIN-2), and an overlap detection circuit 408 for detecting an overlap period between the respective signal bundles (SIN-1 and SIN-2).

Figure 13:
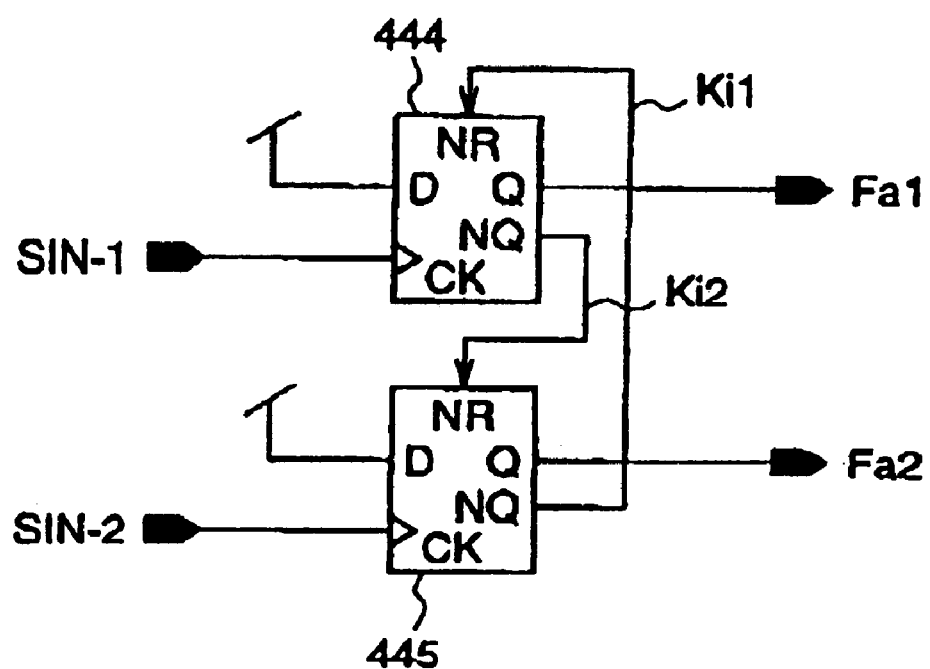
FIG. 13 is a diagram illustrating the construction of an early/late detection circuit which is included in the synchronization circuit according to the fourth embodiment.

As shown in FIG. 13, the early/late detection circuit 407 is provided with a first flip-flop 444 for receiving the first input signal SIN-1, and a second flip-flop 445 for receiving the second input signal SIN-2. One of the first and second flip-flops 444 and 445 which receives the input signal earlier than the other flip-flop outputs a signal Ki1 or Ki2 to the other flip-flop 444 or 445 indicating that inputting should be stopped. When the first input signal SIN-1 is inputted earlier than the second input signal SIN-2, the first flip-flop 444 outputs an early/late detection signal Fa1. When the second input signal SIN-2 is inputted earlier than the first input signal SIN-1, the second flip-flop 445 outputs an early/late detection signal Fa2.

Figure 14:
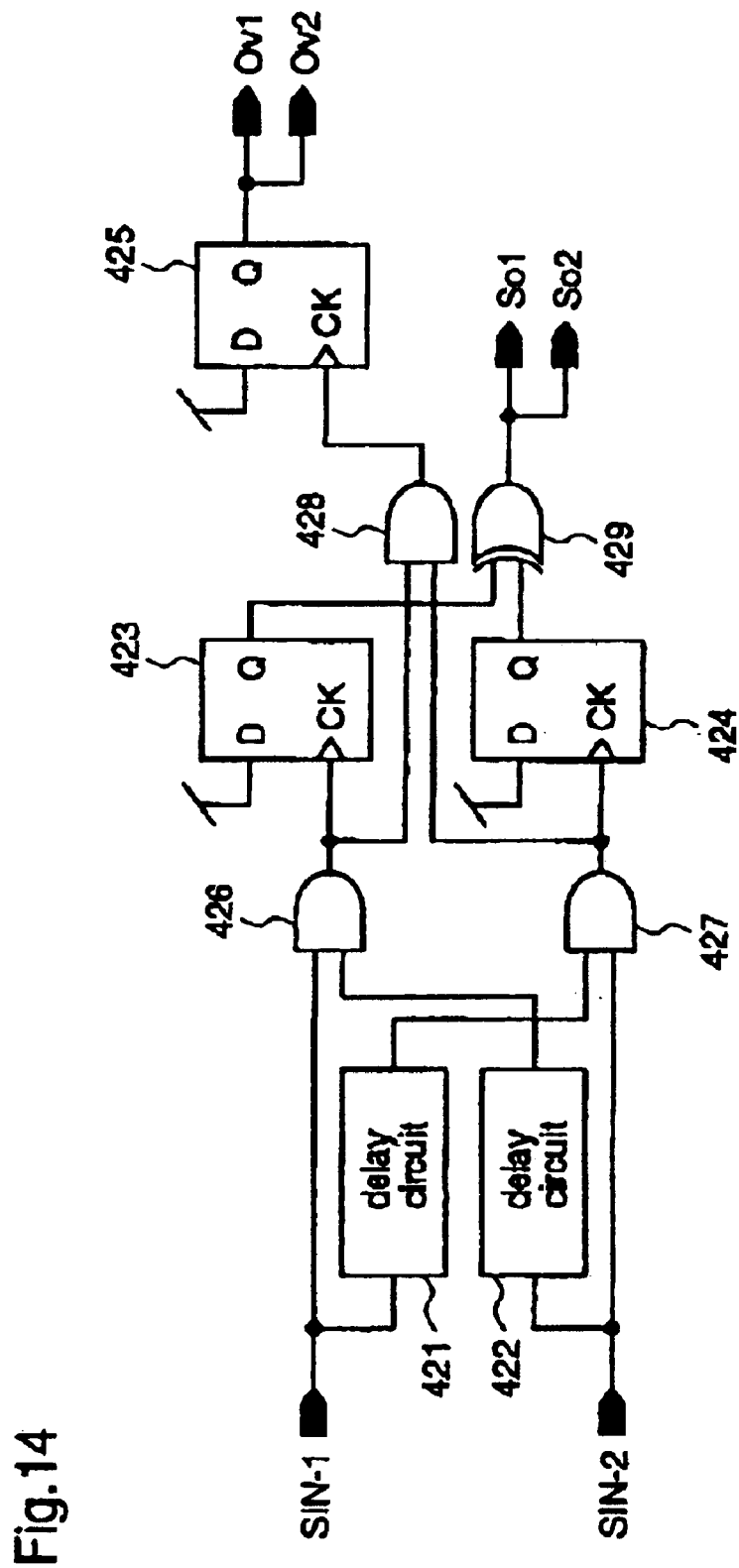
FIG. 14 is a diagram illustrating the construction of an overlap detection circuit which is included in the synchronization circuit according to the fourth embodiment.

As shown in FIG. 14, the overlap detection circuit 408 is provided with: a first delay circuit 421 for adding a delay to the first input signal SIN-1, a second delay circuit 422 for adding a delay to the second input signal SIN-2, a first AND circuit 426 for receiving the first input signal SIN-1 and the output signal of the second delay circuit 422, a second AND circuit 427 for receiving the second input signal SIN-2 and the output signal of the first delay circuit 421, a third AND circuit 428 for receiving the output signal of the first AND circuit 426 and the output signal of the second AND circuit 427, an XOR circuit 429 for receiving the output signal of a first flip-flop 423 and the output signal of a second flip-flop 424, the first flip-flop 423 for receiving the output signal of the first AND circuit 426, the second flip-flop 424 for receiving the output signal of the second AND circuit 427, and a third flip-flop 425 for receiving the output signal of the third AND circuit 428.

Figure 15:
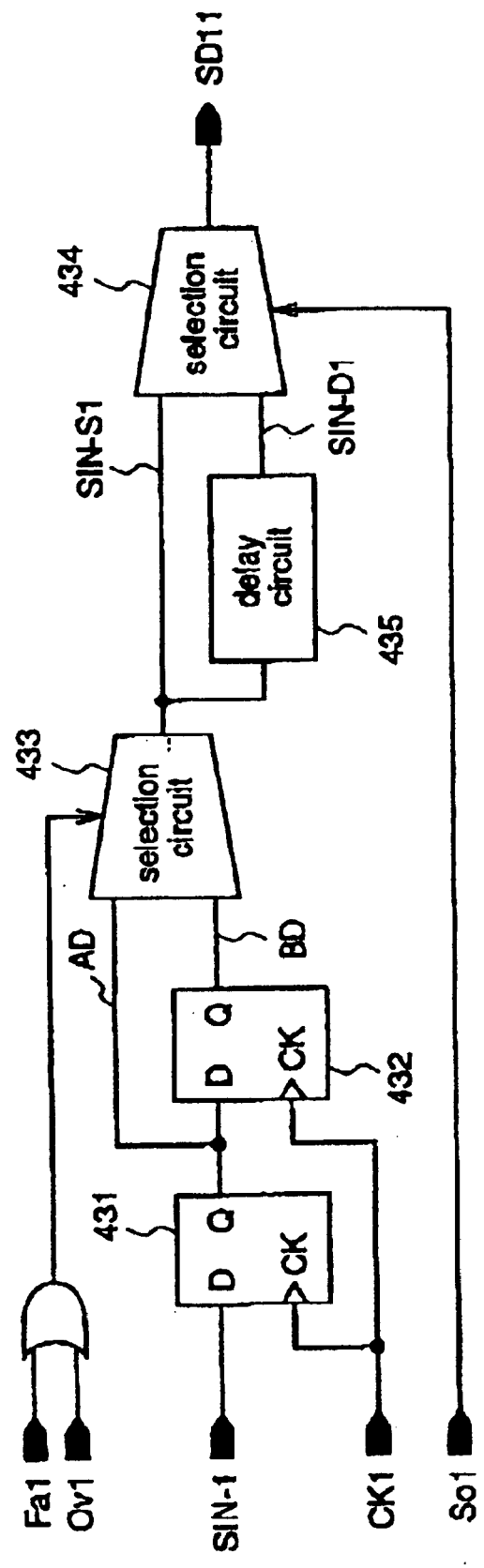
FIG. 15 a diagram illustrating the construction of a delay selection circuit which is included in the synchronization circuit according to the fourth embodiment.

As shown in FIG. 15, the first delay selection circuit 403 is provided with: a first flip-flop 431 for receiving the first input signal SIN-1 and the first clock signal CK1, and outputting a signal AD; a second flip-flop 432 for receiving the output signal AD of the first flip-flop 431 and the first clock signal CK1, and outputting a signal BD; a first selection circuit 433 for selecting the output signal BD of the second flip-flop 432 when either the early/late detection signal Fa1 or the overlap detection circuit Ov1 is input, while selecting the output signal AD of the first flip-flop 431 when no signal is inputted; a delay circuit 435 for adding a delay time Tdelay to the output signal SIN-S1 of the selection circuit 433, and outputting a delay-added signal SIN-D1; and a second selection circuit 434 for selecting the output signal SIN-S1 of the first selection circuit 433 when the overlap detection signal So1 is not inputted, while selecting the output signal SIN-D1 of the delay circuit 435 when the overlap detection signal So1 is inputted. The first selection circuit 433 and the second selection circuit 434 are 2:1 selectors.

The operation of the synchronization circuit of the fourth embodiment as constructed in the manner as described above will now be described.

Figure 11:
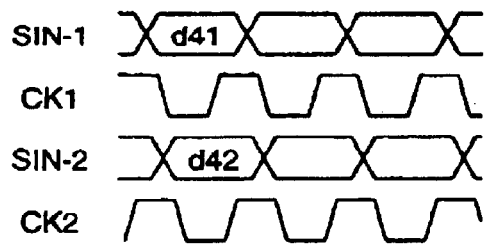
FIG. 11 is a timing chart illustrating input signals to be inputted to the synchronization circuit according to the fourth embodiment.

The first input signal SIN-1 is input to the first delay selection circuit 403 and the state detection circuit 401, the second input signal SIN-2 is input to the second delay selection circuit 404 and the state detection circuit 401, the first input clock CK1 is input to the first delay selection circuit 403 and the clock selection circuit 402, and the second input clock CK2 is input to the second delay selection circuit 404 and the clock selection circuit 402. While the first input signal SIN-1 and the first input clock CK1 (the second input signal SIN-2 and the second input clock) are inputted in synchronization with each other as shown in FIG. 11, the first input signal SIN-1 and the second input signal SIN-2 are asynchronous to each other. Further, data d41 and data d42 are signals to be synchronized.

Initially, in the state detection circuit 401, the early/late detection circuit 407 detects as to which signal is earlier in input timing between the first input signal SIN-1 and the second input signal SIN-2, and outputs a first detection signal Fa1 to the clock selection circuit 402 when the first input signal SIN-1 is earlier, or outputs a second detection signal Fa2 to the clock selection circuit 402 when the second input signal SIN-2 is earlier. When the first detection signal Fa1 is input to the clock selection circuit 402, the clock selection circuit 402 outputs the first input clock CK1 as a synchronization clock SCK to the first flip-flop 405 and the second flip-flop 406. On the other hand, when the second detection signal Fa2 is input to the clock selection circuit 402, the clock selection circuit 402 outputs the second input clock CK2 as a synchronization clock SCK to the first flip-flop 405 and the second flip-flop 406.

On the other hand, in the state detection circuit 401, the overlap detection circuit 408 detects an overlap period between the first input signal SIN-1 and the second input signal SIN-2. When the overlap period is longer than a delay time Tso, the overlap detection circuit 408 outputs a first detection signal Ov1 and a second detection signal Ov2 to the first delay selection circuit 403 and the second delay selection circuit 404, respectively. When the overlap period is shorter than the delay time Tso, the overlap detection circuit 408 outputs a first detection signal So1 and a second detection signal So2 to the first delay selection circuit 403 and the second delay selection circuit 404, respectively.

In the first delay selection circuit 403, when either the first detection signal Ov1 or the first detection signal Fa1 from the state detection circuit 401 is input to the first selection circuit 433, the output signal BD from the second flip-flop 432 is selected. Otherwise, the output signal AD from the first flip-flop 431 is selected. Further, when the overlap detection signal So1 is input to the second selection circuit 434, the output signal SIN-D1 of the delay circuit 435 is selected and outputted as a first signal SD11 to the first flip-flop 406. Otherwise, the output signal SIN-S1 of the first selection circuit 433 is outputted as a first signal SD11. Then, in the first flip-flop 405, the first output signal SD11 of the first delay selection circuit 403 is synchronized with the synchronization clock SCK which is outputted from the clock selection circuit 402 so to be output as a first synchronizing signal SOUT11.

Further, the second delay selection circuit 404 is controlled by the output signals Ov2, So2, and Fa2 of the state detection circuit 401 in a similar like manner as described above for the first delay selection circuit 403, and a second signal SD21 is output to the second flip-flop 406. Then, in the second flip-flop 406, the second output signal SD21 of the second delay selection circuit 404 is synchronized with the synchronization clock SCK which is outputted from the clock selection circuit 402 so as to be output as a second synchronizing signal SOUT21.

Figure 16:
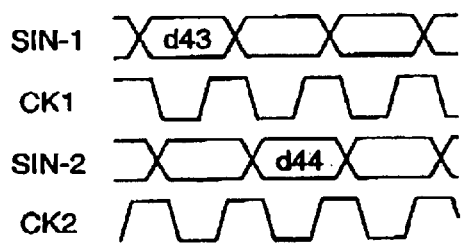
FIG. 16 is a timing chart illustrating input signals to be inputted to the synchronization circuit according to the fourth embodiment.
Figure 17:
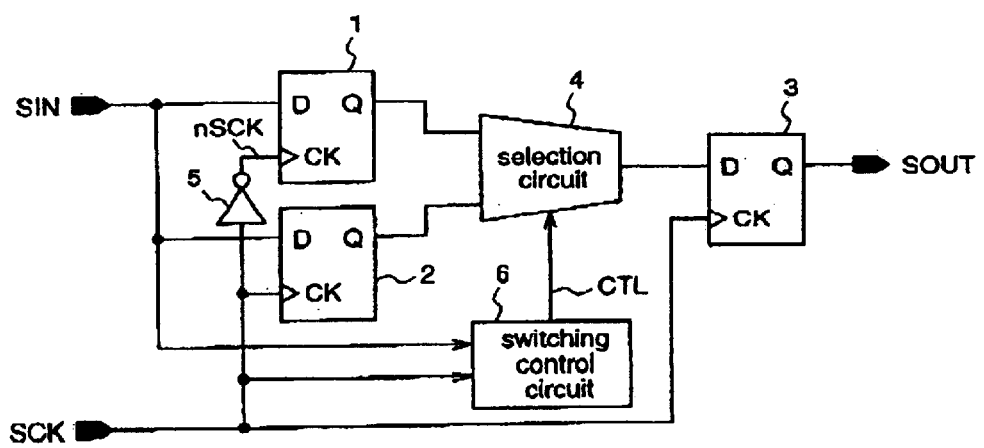
FIG. 17 is a block diagram illustrating the construction of the conventional synchronization circuit.

In this way, the first signal bundle SIN-1 and the second signal bundle SIN-2, which have been inputted asynchronously to each other, are synchronized. Since these signals are synchronized even when the data d43 and d44 to be synchronized have no overlap period as shown in FIG. 16, displacements of pictures or the like can be avoided.

While two input signals are adopted in the fourth embodiment, an arbitrary number of input signals not less than two may be adopted. Further, as for clocks to be input in synchronization with the respective input signals, an arbitrary number of clocks not less than two may be adopted. Thus, the number of input signals and the number of clocks may be arbitrarily selected as long as the above-mentioned functions are satisfied, and the present invention is not restricted to the above-described construction.

The synchronization circuit according to the fourth embodiment is provided with the state detection circuit 401 for receiving two signal bundles each comprising a set of plural synchronous input signals and a single clock having a frequency which is equivalent to a transfer rate of the plural input signals, in which the input signals that are included in one signal bundle is irrelevant to the input signals that are included in the other signal bundles, and for detecting the state between the input signals included in the respective signal bundles. The synchronization circuit according to the fourth embodiment is also provided with: the clock selection circuit 402 for receiving the clock CK1 and the clock CK2 which are included in the respective signal bundles, and selecting one of the input clocks CK1 and CK2 as a synchronization clock SCK based on the result of the state detection that performed by the state detection circuit 401; the first and second delay selection circuits 403 and 404 for respectively adding delays to the plural input signals SIN-1 and SIN-2 which are included in the respective signal bundles based on the result of the state detection that is performed between the respective signal bundles; and the first and second latch circuits 405 and 406 for synchronizing the first and second output signals SD11 and DS21 from the first and second delay selection circuits 403 and 404 with the synchronization clock SCK, respectively. Since it is not necessary to invert the input signal SIN-1 and the input signal SIN2 as in the conventional circuit, the input signals SIN-1 and SIN-2 can be synchronized with each other by using the synchronization clock SCK without considering the temporal relationship between the signal indefinite period of each input signal and the edge of the synchronization clock. As a result, a synchronization circuit that can perform the above-mentioned synchronization of the respective input signals SIN-1 and SIN-2 without adding latency to the input signals, even when there is no overlap period of data to be synchronized, can be implemented with a relatively simple construction.

In the respective embodiments of the present invention, a preamble signal indicating the positional relationship between the data to be synchronized may be input to the state detection circuit so as to detect a preamble pattern of the input signal, and as a result, whereby the positional relationship between the data to be synchronized can easily be detected.

The synchronization circuit according to the present invention is useful as a circuit which is capable of increasing the data transmission efficiency in a data transmission system such as a digital transmission apparatus.

What is claimed is:

1. A synchronization circuit for receiving an input signal and a clock having a frequency which is equal to a transfer rate of the input signal, and synchronizing the input signal with the clock, said circuit comprising:

a state detection circuit for receiving the input signal and the clock, and outputting a control signal according to the temporal relationship between a transition point of the input signal and an edge of the clock;

a delay selection circuit for directly receiving the input signal and the control signal outputted from said state detection circuit, adding a delay to the input signal on the basis of the control signal, and outputting an output signal; and a latch circuit for receiving the clock and the output signal outputted from said delay selection circuit, synchronizing the output signal outputted from said delay selection circuit with the clock and outputting the synchronized signal.

2. A synchronization circuit for receiving an input signal and a clock having a frequency which is equal to a transfer rate of the input signal, and synchronizing the input signal with the clock, said circuit comprising:

a state detection circuit for outputting a control signal according to the temporal relationship between a transition point of the input signal and an edge of the clock;

a delay selection circuit for adding a delay to the clock on the basis of the control signal; and a latch circuit for synchronizing the input signal with the clock outputted from said delay selection circuit, and outputting the synchronized signal.

3. A synchronization circuit for receiving plural input signals having phases which are irrelevant to each other and a clock having a frequency which is equal to a transfer rate of the plural input signals, and synchronizing the plural input signals with the clock, said circuit comprising:

a state detection circuit for outputting control signals relating to the respective input signals, according to the temporal relationship between transition points of the plural input signals;

a delay selection circuit for adding delays to the respective input signals on the basis of the control signals relating to the respective input signals; and a latch circuit for synchronizing the respective signals outputted from said delay selection circuit with the clock, and outputting the synchronized signals.

4. A synchronization circuit for receiving plural signal bundles each comprising a set of plural input signals which are synchronized with each other and a single clock having a frequency which is equal to a transfer rate of the plural input signals, in which the phases of the input signals included in one signal bundle are irrelevant to the phases of the input signals included in the other signal bundles, and for synchronizing the input signals included in one signal bundle with the input signals included in the other signal bundles by using a single synchronization clock that is selected from among the clocks included in the respective signal bundles, said circuit comprising:

a state detection circuit for detecting the state between the plural input signals included in the respective signal bundles;

a clock selection circuit for receiving the clocks included in the respective signal bundles, and selecting one of the inputted clocks, as a synchronization clock, on the basis of the result of the state detection performed between the respective signal bundles by the said state detection circuit;

a delay selection circuit for adding delays to the plural input signals included in each signal bundle, on the basis of the result of the state detection performed between the respective signal bundles by said state detection circuit; and a latch circuit for synchronizing the output signal from said delay selection circuit for each signal bundle, with the selected synchronization clock, and outputting the synchronized signal.

5. A synchronization circuit as defined in claim 4, wherein said state detection circuit comprises:

an early/late detection circuit for detecting which signal bundle is earlier in input timing between the respective signal bundles, and outputting an early/late detection signal; and an overlap detection circuit for detecting an overlap period between the respective signal bundles, and outputting an overlap detection signal;

wherein said clock selection circuit is operable to seltect, as a synchronization clock, a clock included in a signal bundle which is determined as being inputted earlier between the respective signal bundles, on the basis of the early/late detection signal; and said delay selection circuit is operable to add delays based on the early/late detection signal and the overlap detection signal to the plural input signals included in the respective signal bundles.

6. A synchronization circuit as defined in claim 1, wherein said delay selection circuit comprises:

a delay circuit for adding a delay to the input signal; and a selection circuit for selecting either the input signal or the output signal of the said delay circuit on the basis of the control signal.

7. A synchronization circuit as defined in claim 2, wherein said delay selection circuit comprises:

a delay circuit for adding a delay to the inputted clock; and a selection circuit for selecting either the inputted clock or the clock outputted from said delay circuit on the basis of the control signal.

8. A synchronization circuit as defined in claim 3, wherein said delay selection circuit comprises:

a delay circuit for adding delays to the respective input signals; and a selection circuit for selecting one signal from among the plural input signals and the signals outputted from said delay circuit, for each of the plural input signals, on the basis of the control signals relating to the respective input signals, and outputting the selected one signal.

9. A synchronization circuit as defined in claim 1, wherein said state detection circuit is operable to detect the state of the input signal on the basis of an externally supplied preamble detection signal which indicates the positional relationship of data to be synchronized.

10. A synchronization circuit as defined in claim 2, wherein said state detection circuit is operable to detect the state of the input signal on the basis of an externally supplied preamble detection signal which indicates the positional relationship of data to be synchronized.

11. A synchronization circuit as defined in claim 3, wherein said state detection circuit is operable to detect the state of the input signal on the basis of an externally supplied preamble detection signal which indicates the positional relationship of data to be synchronized.

12. A synchronization circuit as defined in claim 4, wherein said state detection circuit is operable to detect the state of the input signal on the basis of an externally supplied preamble detection signal which indicates the positional relationship of data to be synchronized.

13. A synchronization circuit as defined in claim 1, wherein said delay selection circuit is operable to add a delay to the input signal on the basis of the control signal without utilizing the clock.

* * * * *